United States Patent
Degani et al.

(10) Patent No.: US 6,175,158 B1
(45) Date of Patent: Jan. 16, 2001

(54) INTERPOSER FOR RECESSED FLIP-CHIP PACKAGE

(75) Inventors: Yinon Degani, Highland Park; Thomas Dixon Dudderar, Chatham; Robert Charles Frye, Piscataway; King Lien Tai, Berkeley Heights, all of NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/149,803

(22) Filed: Sep. 8, 1998

(51) Int. Cl.[7] .................................................. H01L 23/48
(52) U.S. Cl. ............................................ 257/777; 257/778
(58) Field of Search ........................... 438/108; 257/777, 257/778, 776

(56) References Cited

U.S. PATENT DOCUMENTS

| | | | |
|---|---|---|---|
| 5,347,162 | * | 9/1994 | Pasch ................................... 257/773 |
| 5,504,035 | * | 4/1996 | Rostoker et al. ..................... 437/182 |
| 5,646,828 | * | 7/1997 | Degani et al. ........................ 257/778 |
| 5,821,624 | * | 10/1998 | Pasch ................................... 257/776 |

* cited by examiner

Primary Examiner—Jerome Jackson, Jr.
Assistant Examiner—Lourdes Cruz
(74) Attorney, Agent, or Firm—Thomas, Kayden, Horstemeyer & Risley LLP (57) ABSTRACT

The specification describes a recessed chip IC package in which the IC chip is bonded to a silicon translator, and power and ground planes for IC power and ground interconnections are formed on separate interconnect levels of the translator. The multilevel interconnection capability of the translator allows crossovers, and allows power and ground pins from the IC chip to be both isolated from signal I/Os, and consolidated into fewer interconnections going to the next board level. The thermal mismatch between the silicon translator and conventional printed wiring board materials is addressed by using an interposer which is essentially a ball grid array of plated-through holes that transfers the interconnect pattern from the translator to the printed wiring board. The interposer may have a composition with a coefficient of thermal expansion (CTE) that lies between the CTE of silicon and the CTE of the board material. It may also be provided with holes or slots for additional stress relief.

19 Claims, 4 Drawing Sheets

INTERPOSER FOR RECESSED FLIP-CHIP PACKAGE

FIELD OF THE INVENTION

This invention relates to flip chip integrated circuit (IC) packages and more specifically to IC packages in which IC chips are recessed into cavities in an interconnection substrate. More specifically it relates to a recessed chip interconnection arrangement in which a single IC chip is interconnected to a translator to provide increased interconnect density.

BACKGROUND OF THE INVENTION

Recessed chip IC packages are gaining acceptance in IC device interconnection technology because of efficient utilization of interconnect substrate area, low overall package profile, and reduced interconnection length. A variety of recessed chip package options are described and claimed in U.S. Pat. No. 5,608,262, issued Mar. 4, 1997 which, for purposes of this disclosure, is incorporated herein by reference.

Recessed chip packages are characterized by three components, a primary IC chip or chips, defined for the purpose of this exposition as a first level component, an intermediate interconnection substrate (IIS) which (in a conventional package) may be either an IC chip or a passive interconnection substrate, defined here as a second level component, and a system interconnection substrate (SIS) which is typically a printed circuit board (PCB) and defined as a third level component. These components are progressively larger in area so that the second level component(s) can support one or more IC chips, and the third level components can accommodate one or more second level components. In a three component package, the first level components are typically flip-chip bonded to the second level components, and the second level components are flip-bonded to the third level component, with the first level components recessed into cavities formed in the third level component.

A number of variations using this basic concept are possible, e.g. the system interconnection substrate can itself function as an intermediate interconnection substrate and attach to a fourth board level, with the second level components recessed into cavities in the fourth level component.

Recessed cavity structures have efficient interconnection arrangements, but there is an ever growing need for denser interconnections and higher interconnection performance.

In co-pending application Ser. No. 09/081,448, filed May 19, 1998, several alternative silicon-on-silicon IC package designs are described which address the problems of thermal mismatch between silicon IC chips and conventional printed wiring board materials. In common with the packages described herein, the packages in the co-pending application are also directed to interconnect arrangements using a silicon intermediate interconnection substrate. The use of silicon-on-silicon in premium interconnection assemblies is growing due in part to the nearly optimum thermomechanical design made possible by the match between the Coefficient of Thermal Expansion (CTE) of the silicon chip and the silicon interconnection substrate. In state of the art silicon-on-silicon packages, the silicon-on-silicon MCM is attached to an intermediate interconnection substrate, and the intermediate interconnection substrate is in turn mounted on a mother board. While it would seem ideal from the standpoint of thermomechanical design to construct all board levels of silicon, the size of the mother boards, and even the size of the intermediate boards, makes this option prohibitively costly. Therefore both the intermediate interconnection boards and the mother boards in multiboard assemblies are typically epoxy/glass laminates.

Typical polymer laminates are not well matched thermomechanically to the silicon-on-silicon interconnection assembly. The CTE of FR-4, the most widely used epoxy laminate printed wiring board (PWB) material, is approximately 16 ppm/° C. The CTE of silicon is 2.6 ppm/° C.

An approach to reducing the thermomechanical mismatch between the silicon-on-silicon assembly and the intermediate board would appear to be to construct the intermediate board of a plastic material that matches the CTE of silicon. However, the shortcoming of this approach is that the mismatch between the intermediate board and the mother board is then unacceptable.

STATEMENT OF THE INVENTION

We have developed an improved interconnection approach for a recessed flip-chip IC package. A preferred embodiment of the improved package uses a translator as described in co-pending application Ser. No. 091,149,804, filed on an even date herewith. The translator provides substantially increased interconnect area, e.g. more than four times the IC chip area. In the preferred embodiment of the invention the translator is silicon, and the translator has multiple levels of interconnection. The multilevel interconnection feature of the translator allows both consolidation of the number of power and ground interconnections at this board level, and re-routing of power and ground I/Os, and signal I/Os, to the next board level. The effectiveness of the translator is further enhanced by using an interposer. The interposer is a ball grid array with through-hole interconnections that essentially transfers the interconnect pattern from the translator to the next board level. The interposer is passive as an interconnection element, and is used to provide strain relief to the package. The interposer is also effective with other intermediate interconnection substrates.

DETAILED DESCRIPTION

State of the art IC chips are now produced with I/O counts that exceed 400. When the number of required interconnections required is this large, the pitch for solder bond interconnections in prior art arrangements is prohibitively small. Conventional interconnection strategies cannot meet the challenge of interconnecting these large IC arrays of interconnections.

Figure 1:
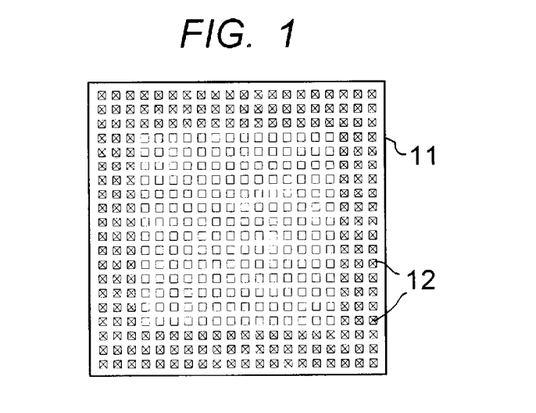
FIG. 1 is a plan view of a high pin count IC chip.

An IC chip with a large area array of interconnection sites is shown in FIG. 1. The IC chip is designated 11, and the area array interconnections sites are designated 12, and 13. The interconnection sites are shown as square but can be round. In a typical illustration the bonding pads are shown, and these can be square but more often are round. In the IC chip design of FIG. 1, the three rows of edge arrayed sites 12, shown with an "x", are signal I/Os, and the interior sites 13, without an "x", are power and ground. These assignments can be changed depending on the circuit design, i.e. the pins can be mixed between signal and power/ground. FIG. 1 shows a total of 400 IC chip interconnection sites, with 196 assigned to power and ground, and 204 assigned to signal. In state of the art IC chips, the combined number of I/O interconnections may be much larger than 400, which more closely represents the interconnection challenge that is addressed by this invention.

The improved interconnection approach, according to the invention, is to use a translator for the second interconnect level, i.e. the substrate to which the IC chip is bonded, and to construct the translator as a large module with multilevel interconnections, so that the large array of interconnections can be accommodated and can cross over, re-route, and fan out. The added area for the translator depends on the number of area array interconnections and the pitch desired for these interconnections. In a typical arrangement according to the invention, the area of the translator is at least 4, and preferably 6, times the area of the IC chip.

Figure 2:
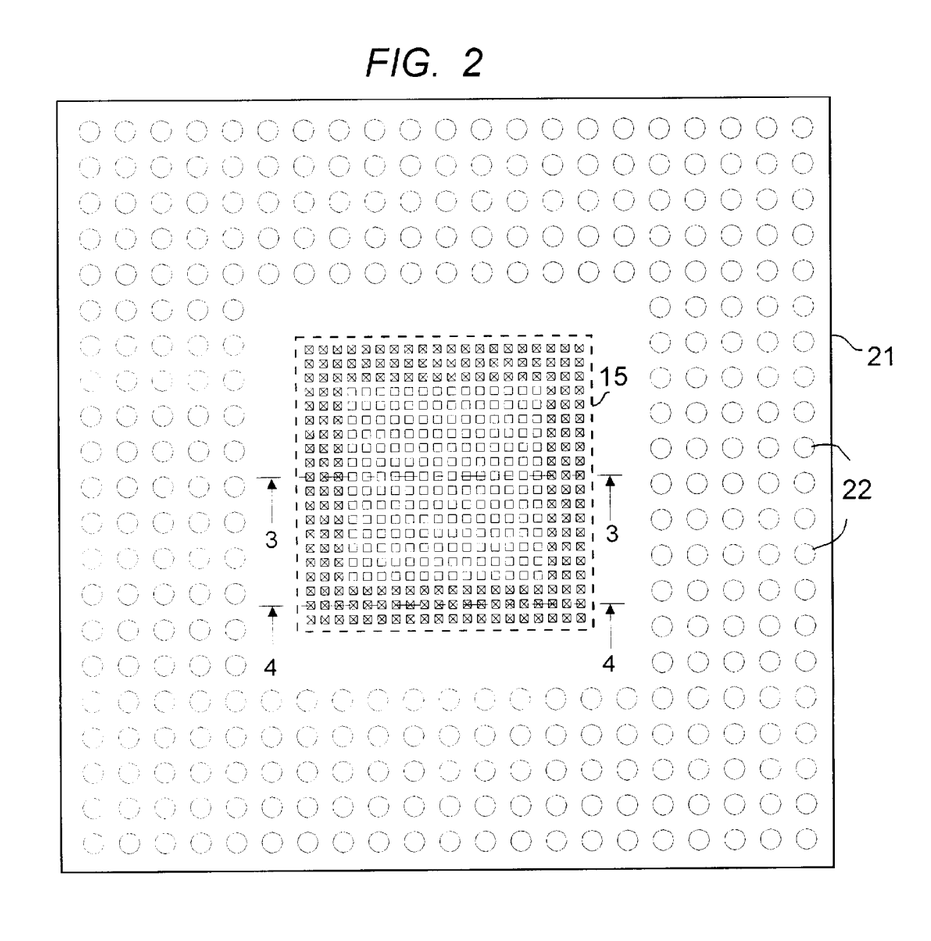
FIG. 2 is a plan view of a translator according to the invention.

A translator for interconnecting the IC chip of FIG. 1 according to the invention is shown in FIG. 2. The central portion of the translator 21 accommodates the IC chip, which flip-chip bonded to the translator. The position of the IC chip is shown at 15 in phantom. The array of IC interconnection sites on the translator mirrors the array on the IC chip. The translator 21 shown in FIG. 2 has an area approximately 7 times the area of the IC chip. The added area outside the IC chip area accommodates interconnection sites 22. This added area is referred to herein as the outboard area, and the interconnection sites in this area are for connections to the next board level.

In the embodiment of FIG. 2 the outboard area accommodates 320 interconnection sites. This number is less than the 400 interconnection sites on the IC chip and is a deliberate choice for reasons that will become apparent. It should be evident that pin for pin sites could be accommodated in the outboard area of the translator of FIG. 2, and still have substantially greater pitch than the pitch of the IC chip interconnections. This design also utilizes the large area of the translator 21 outboard of the chip site to fan out the large array of interconnections, i.e. to increase the pitch of the outboard interconnections that go to the next level. The advantage of having a large pitch at this level in the package is that the translator can be flip-bonded to a printed wiring board or a ball grid array (BGA) using large solder bumps or balls. Large solder interconnections are more reliable and can be made with higher yield. The bump or ball pads at the interconnection sites 22 are solder wettable pads of e.g. Cu—Cr alloy, or Ti—Pt—Au.

In typical translator structures according to the invention the pitch of the interconnections in the outboard will be larger than the pitch of the IC interconnections. If the outboard area is more than four times the IC chip area, the pitch of the interconnection sites in the outboard area will normally be at least twice the pitch of the IC interconnections at the IC chip site. The pitch is the center-to-center spacing between interconnections sites.

Figure 3:
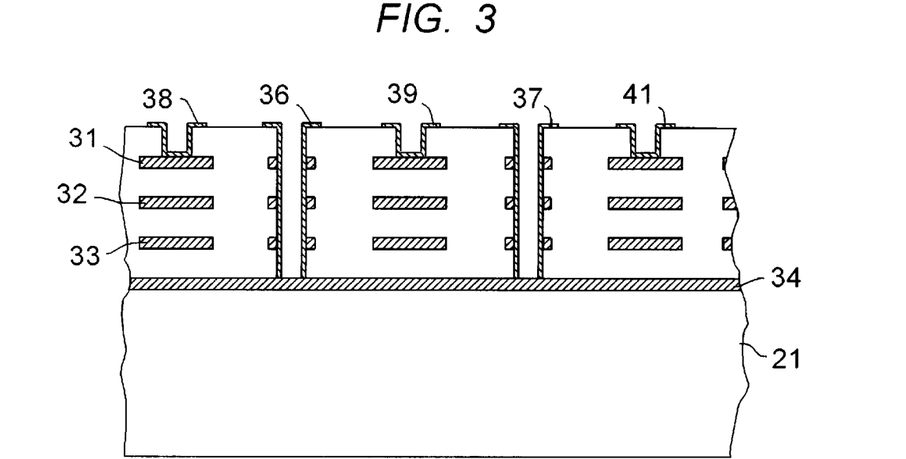
FIG. 3 is a partial cross section through 3—3 of FIG. 2.

A partial cross section of the translator of FIG. 2, including five of the area interconnection sites in the center region, is shown in FIG. 3. FIG. 3 is a detailed view of a portion of the center of the section 3—3 of FIG. 2. An important feature of this package design is evident in this figure, where the multilevels of interconnection can be seen.

The U-shape of each of the interconnections 36–41 represents the conventional solder wettable metal of the contact pad. The via is typically offset slightly in the plane of the figure as will be understood by those skilled in the art.

In the interconnection arrangement of FIG. 3 the area array in the center of the IC chip site is for power and ground interconnections. The translator according to the invention has special features for power and ground interconnections. A single interconnect level is reserved for power, and another level, preferably isolated from the first level by intervening levels, is reserved for the ground interconnections. FIG. 3 shows four levels of interconnection 31, 32, 33, and 34. For clarity, the interlevel dielectric layers are not individually shown in the figures but it will be evident to those skilled in the art that there is a first interlevel dielectric layer between conductive layers 33 and 34, a second interlevel dielectric layer between conductive layers 32 and 33, a third interlevel dielectric layer between conductive layers 31 and 32, and a top dielectric layer between conductive layer 31 and the pads 36–41. The bottom conductive level, 34, is a ground plane, and the top level 31 is a power plane. The two intermediate conductive levels 32 and 33 are assigned to signal I/Os. Conductive levels 31–33 are each shown with conductor patterns to illustrate the multilevel concept. In the view shown, if all the interconnections in the area array are power and ground, the conductor pattern for the second and third levels may be absent in this view. However, providing conductor patterns in the center section offers the designer the option of intermixing signal I/Os and power and ground I/Os at any location on the IC chip, and therefore at any corresponding location in the center of the translator. The arrangement shown, with the intermediate levels assigned to signal I/Os and the top and bottom levels to power and ground respectively, has the advantage of isolating power and ground, but other assignations are obviously useful. The bottom interconnect level 34 may be assigned to either power or ground, or both, but is preferably the ground plane, and is shown as a continuous sheet since no interconnections are made through this level. The ground plane can be the substrate, e.g. doped silicon, but for higher conductivity the substrate can be coated with a more conductive material e.g. Al, Ti-Pd-Au, or Au. The interconnect level 31 is a mesh of conductive material with openings as shown. The interconnection sites 36 and 37 are connected to the ground plane 34, and interconnection sites 38, 39 and 41 are connected to the power plane 31. The power and ground planes extend throughout the translator area, so that any one of the pads 22 can be connected to power and ground by providing a via to level 31 or 34 at the desired site in the outboard region of the translator.

Figure 4:
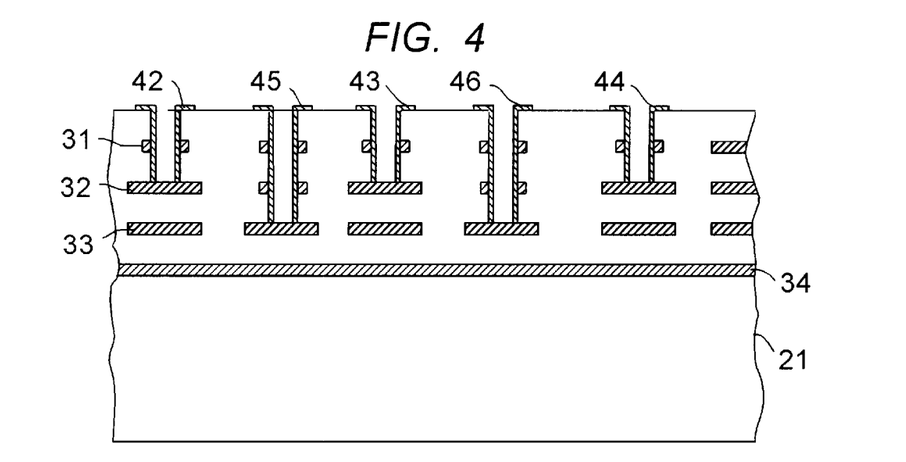
FIG. 4 is a partial cross section through 4—4 of FIG. 2.

A section view of the rows of interconnection sites at the edge of the array, i.e. those with an "x" in FIG. 2 and assigned to signal I/Os in this embodiment, is given in FIG. 4 which is a view of a portion of FIG. 2 along section 4—4. Here edge array interconnection sites 42, 43 and 44 are connected to interconnect level 32 using vias as shown, and interconnection sites 45 and 46 are connected to level 32. The conductor patterns for levels 32 and 33 are conventional, i.e. a single runner connecting site 42 with a selected site 22 in the outboard region. By contrast, the power and ground interconnections from the IC chip are aggregated together on the power and ground plane sheets. As described above the ground sheet is continuous and the power sheet is a mesh. Interconnections are made to these sheets at any desired site 22 in the outboard region using an appropriate via. This allows the circuit designer the freedom to re-route power and ground, and to change the number of power and ground interconnections coming off the translator from the number coming on.

FIG. 2 shows 204 IC chip signal I/O interconnection sites, and 196 power and ground interconnection sites. However, there are just 320 interconnection sites 22 in the outboard region of the translator. Typically, each signal I/O from the IC chip is interconnected pin for pin at each board level, which consumes 204 of the 320 sites, leaving 116 for power and ground. As is evident from the above description, the power and ground interconnections between board levels are not discrete. In a typical circuit design, there is a need for a large number of power and ground interconnection sites, spaced around the outboard region, but typically this number is significantly fewer than the number of power and ground interconnections that come off the IC chip. Thus the translator of the invention serves both to consolidate the power and ground connections, and redistribute them spatially. This consolidation function at a board level that in the prior art has been primarily a 1 for 1 pass through level, is an important advance in recessed flip chip packaging. Reducing power and ground interconnections by, e.g., at least 10% is regarded as significant. In addition, the ability to design crossovers at this board level, to achieve re-routing, to isolate power and ground, and to achieve fan out represents a major advance in interconnect technology.

Figure 5:
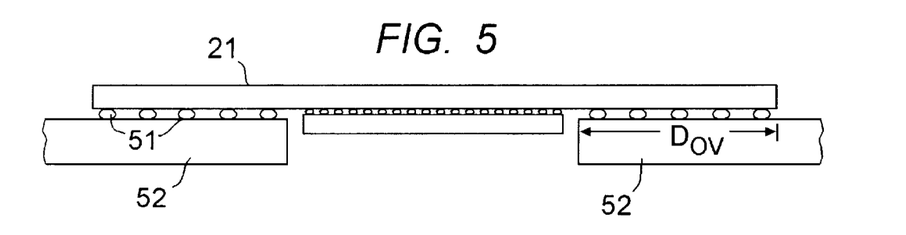
FIG. 5 is a front partial view of an assembled IC package with the translator of FIG. 2.

As shown in FIG. 5, the translator 21 is then ball or bump soldered, by a series of interconnections 51, to the next board level 52, with the IC chip recessed as shown. The interconnection level 52 is preferably a ball grid array which provides reliable bonding of the many I/O leads from the translator to the next board level. The board level 52 may be an intermediate board level, or may be the system printed wiring board (PWB), i.e. the mother board. In either case an opening is provided in this level where the IC chip is recessed. It will be noted that the solder balls interconnecting the translator 21 to the board 52 are substantially larger than those interconnecting the IC chip to the translator. The IC chip interconnections are typically flip-chip micro-joints of e.g. 50 to 200 microns in diameter, while the BGA balls are typically 20 to 100 mils in diameter. This difference is important from the standpoint of stress relief. It is evident that the potential strain due to thermal mismatch between the silicon translator 21 and the printed wiring board 52 has been increased substantially in this package design. The overlap region, $D_{ov}$ in FIG. 5, is filled with added interconnections and is larger than in a conventional structure. A typical recessed chip package has one or two rows of interconnections on the overlap region. In the translator embodiment shown FIG. 5, there are five rows of interconnections in the overlap region. A useful translator will have a minimum of about four rows of interconnections. While the added area of the translator increases the potential strain at this package level, the additional interconnections are large as just described, and thus less susceptible to failure due to strain.

It should be evident that the invention is applicable to PWB interconnection arrangements wherein the cavity for the IC chip extends completely through the thickness of the board, and the IC chip is mounted so as to recess significantly below the surface of the board, thus reducing the package profile. These structures, and the cavity for the IC chip, are quadrangular in shape, and frequently square in shape. In principle, recessed chip packages can be made with the IC chip recessed into a depression, i.e. the cavity for the IC chip extends only partially through the printed wiring board to which the translator is attached. The term printed wiring board when used to define the invention refers to standard epoxy boards, for example, FR4, to ball grid array interconnect substrates, and any other suitable interconnect substrate.

The material of the translator is preferably semiconductor, to match the coefficient of thermal expansion (CTE) of the IC chip. Most typically this will be silicon. An advantage of using silicon is that can be sufficiently conductive to serve as the bottom conductor level. Another advantage of using silicon is that the interconnection technology, for forming multiple levels of interconnections on the silicon, is well known and is used in principle in making the IC chip itself. Thus the multilevel interconnections can be made using $SiO_2$ for the interlevel dielectric and aluminum for the metallization as is standard in Si IC technology. However, the interconnections on the translator are significantly larger than those on the IC chip and can be made with a less precise and less expensive technology. Thus a preferred method for forming multilevel interconnections patterns on the translator, i.e. like levels 31–34 of FIGS. 3 and 4, is to use a spin on material for the interlevel dielectric. Spin-on materials include spin-on-glass (SOG) and a variety of known polymer materials such as polyimide. The multilayer conductor patterns may be made with any suitable metal, e.g. copper, aluminum, Au, Ti—Pd—Au, etc. The vias can be made by any suitable coating technique, e.g. sputtering. The thickness of the layers 31–34 and the interlevel dielectrics is small, so that coating the vias with a conventional sputtering process is not difficult. Via plugs can be used if desired.

Whereas silicon (or semiconductor) is the preferred material for the translator, advantages of the invention, e.g. the large area interconnection substrate with multilevel interconnect capability, can also be realized using other materials, notably ceramic. If an insulating material such as ceramic is used, a metal layer can be deposited on the insulating material for the bottom interconnection level.

As noted earlier, the invention primarily addresses IC packages wherein the IC has more than 400 I/Os. Also as noted earlier the size of the translator should be substantially larger than the IC to accommodate this large number of interconnections in the outboard region of the translator. In most package designs where a translator A is used the longest dimension (length) of the translator will exceed the longest dimension of the IC by at least a factor of 2, and preferably 2.5. In terms of the area of the translator relative to the area of the IC chip, the translator area will in most cases exceed the IC chip area by a factor of at least 4, and preferably by a factor of at least 6.

In a conventional package, the silicon-on-silicon module is bonded to a laminated epoxy PWB. The PWB may also have other soldered components such as capacitors and resistors surface mounted on the PWB. The laminated PWB typically consists of epoxy/glass, commonly referred to in the art as FR-4. The CTE for this material is approximately 16 ppm/° C. For high density interconnect packages, the PWB may be mounted with solder interconnections on another laminated board, e.g. a mother board, which is typically the final level of interconnection. The mother board typically is an FR-4 board, or one of several alternative materials known in the art that have comparable CTE values typically well above 10 ppm/° C. Efforts can be made to select laminated board materials that have matched CTE values, i.e. values close to 16 ppm/° C., to minimize the differential thermal expansion problems described earlier.

As will be appreciated by those skilled in the art, the thermomechanical properties of epoxy and common interconnect board materials are nominally compatible with each other. However, there is a significant incompatibility in thermomechanical properties between conventional printed wiring boards and the silicon translator described above.

Figure 6:
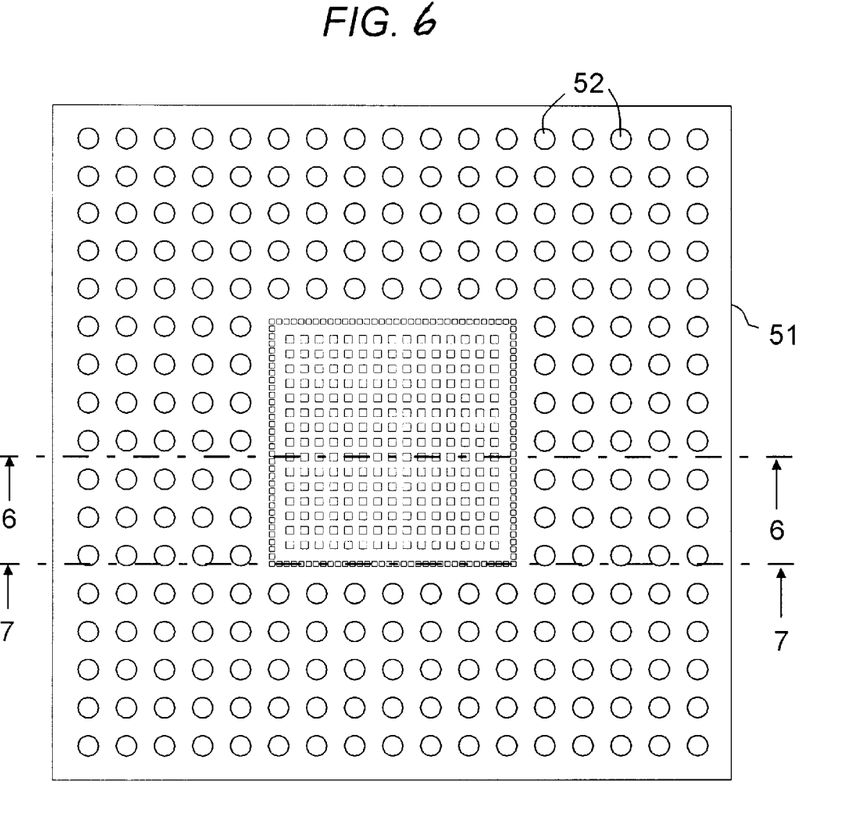
FIG. 6 is a plan view of one embodiment of an interposer used between the translator and the printed wiring board.
Figure 7:
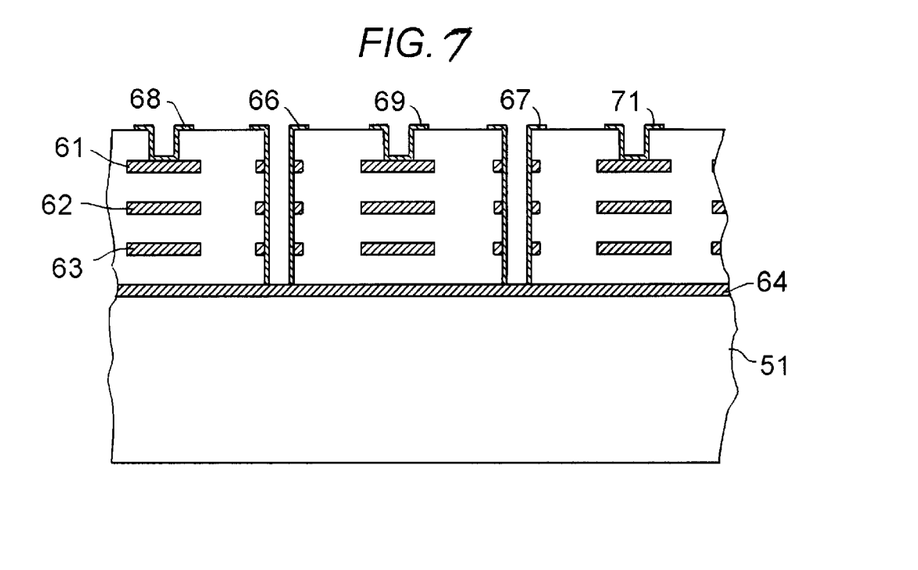
FIG. 7 is a front partial view of an assembled flip-chip package showing the combination of a translator and an interposer according to the invention.

To at least partially overcome the thermomechanical incompatibility between the translator 21 and the epoxy/glass laminated PWB 52 in FIG. 5, an interposer is provided between the translator and the printed wiring board. The interposer is essentially an array of plated through hole interconnections. In a preferred embodiment it is apertured to provide strain relief. One embodiment of an interposer according to the invention is shown in FIG. 6 and consists of a board 61, with a pattern of plated-through holes 62 that matches the pattern of interconnections 51 on the translator. Adjacent each plated-through hole 62, and on each side of the interposer 61, is a bonding pad 63. The bonding pads are connected to the plated-through hole by a short runner, or they overlap or abut one another as shown in FIG. 7. In either case the array of bonding pads 63, and the array of plated-through holes 62, are one for one replications of the interconnect pattern on the translator. The purpose of the interposer is to provide stress relief and does not serve a traditional interconnection function. An opening 64 is made in the interposer to allow the IC chip to be recessed when the package is assembled. The opening or cavity 64 is essentially the same in size and function as the cavity in the PWB 51 of FIG. 5.

The interposer is shown as part of an overall flip-chip IC interconnection assembly, with a translator as described above, in FIG. 7. The IC chip 71 is flip-chip solder ball or bump bonded to translator 72 by solder bonds 73. The translator 72 is flip-bonded to the interposer 61 by ball bonds 75. The interposer 61 is ball bonded to printed circuit board 76 by ball bonds 77. The solder bonding is conventional. For simplicity in illustrating this aspect of the invention the solder pads are not shown but are also conventional, e.g. Cu-Cr.

To provide additional thermal mismatch protection, the material of the interposer can modified to result in a CTE of the interposer of below 10 ppm/° C., and preferably below 6 ppm/° C. This can be achieved by adjusting the loading of the glass, or other fiber reinforcement material e.g. aramid, and other additives in the epoxy/glass PWB in known fashion, or by proper selection of the epoxy. The thermomechanical properties of epoxy and other suitable PWB materials are well known in the art. Useful materials are polyimide/kevlar, epoxy/polyimide/kevlar, and epoxy/graphite. The reinforcement material, and the amount of reinforcement material in the laminate, can be chosen to provide a low CTE. For example, graphite fiber has a CTE of 0.5–1 ppm/° C., so that increasing the amount of graphite fiber in the laminate can reduce the CTE to desired levels.

Preferably the CTE of the interposer is made comparable to that of silicon ±3 ppm/° C., and significant advantages obtain of the CTE is within ±1 ppm/° C. If the mismatch is 1 ppm/° C. or less the epoxy underfill typically used in conventional flip-chip bonding may be unnecessary and can be eliminated. The material comprising the printed wiring board 76 also preferably has a CTE comparable to that of the interposer, i.e. below 10 ppm/° C., and preferably below 6 ppm/° C., or within ±3 or ±1 ppm/° C.

Three level interconnect assemblies constructed according to these principles have unexpectedly low differential thermal expansion between levels, and the effective lifetime of the solder bumps interconnecting them will be substantially increased. If desired, conventional epoxy underfill can be provided between any of these levels. For example, in this package design the largest thermal mismatch will normally occur between the translator and the interposer. Therefore there may be an advantage in filling the space between the interposer 61 and the translator 72 (FIG. 7).

Figure 8:
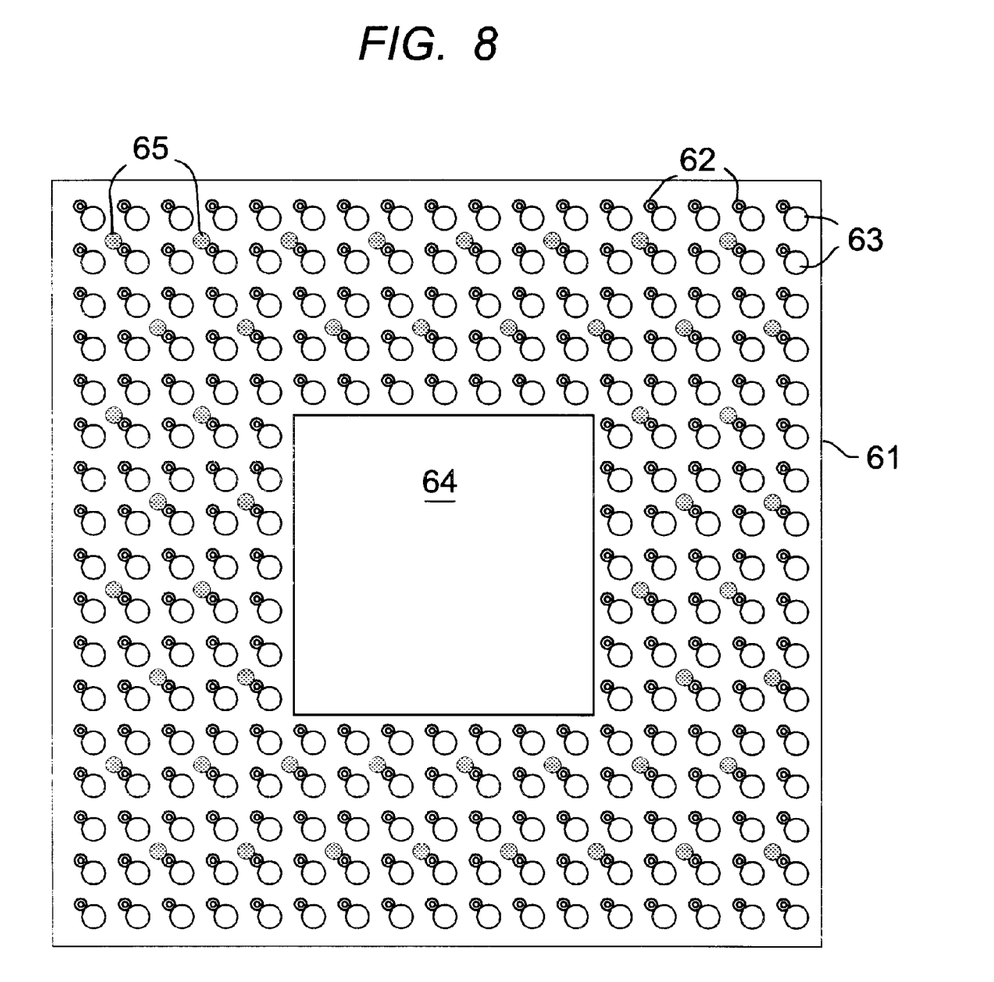
FIG. 8 is a plan view of another embodiment of the interposer of the invention.

Another expedient for overcoming differential thermal expansion between the translator and the interposer board levels is shown in FIG. 8. The same reference numerals used in FIGS. 6 and 7 designate the same elements. The added feature in the interposer of FIG. 8 is an array of through holes 85, which are drilled through the BGA board 61 to provide stress relief in the interposer. These holes are preferably larger than the plated-through holes and typically will be bare, i.e. with no plating or coating. Alternatively, through holes with other shapes, e.g. slots, may be provided instead of holes. It is convenient to drill or cut these stress relief openings when the plated-through holes are drilled, and then mask them during the plating operation.

As shown in FIG. 7 the printed wiring board 76 does not require a recess for the IC chip, the recess in the BGA interposer being sufficient. In some cases, depending on the relative thickness of the elements in the package, and the standoff required for the ball or bump bonds, the printed wiring board 76 may require an opening essentially congruent with the opening in the interposer 61. Although the interposer shown in FIG. 7 extends only under the single translator shown, it may be made with multiple openings and support multiple translators.

Conventional silicon-on-silicon packages have been designed with intermediate interconnection substrates that have an essentially picture frame structure, with the opening in the picture frame accommodating the recessed chip from the next interconnect level. However, the interposer of this invention has the unusual feature that the array of interconnection sites on one side of the interposer are essentially in alignment, with the array of interconnection sites on the other side of the interposer, i.e. aligned vertically through the thickness of the interposer. Thus there is no re-routing or fan-out in the interposer. The bonding pads on either side of the interposer may be disposed on opposite sides of the through-holes, in which case the bonding pads themselves may not be precisely aligned vertically. However, the prescription that the interconnection sites be aligned on both sides of the interposer is intended to cover this variation. The configurations of the two arrays of bonding sites will usually be essentially the same.

The term array is used herein to define a multiplicity of elements distributed over a surface. The term configuration is used in the appended claims to define a particular spatial geometry for the array.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An IC package comprising:
   a. a printed wiring board (PWB),
   b. a series of PWB bonding pads on said PWB,
   c. an interposer, said interposer comprising:
      i. a picture frame structure with a first side and a second side, and an opening at least partially through said picture frame structure, ii. a first array of interposer bonding pads on said first side of said picture frame structure, iii. a second array of interposer bonding pads on said second side of said picture frame structure, with said second array of interposer bonding pads and said first array of interposer bonding pads approximately aligned vertically through the thickness of the interposer, said second array of interposer bonding pads connected to said series of PWB bonding pads, d. a silicon on silicon interconnection module comprising:
  i'. a silicon interconnection substrate having an upper surface and a lower surface and an area A,
  ii'. a first array of substrate bonding pads in the center of the lower surface of the silicon interconnection substrate adapted to be interconnected to a silicon IC chip,
  iii'. a second array of substrate bonding pads around the first array of substrate bonding pads, and
  iv'. at least one silicon IC chip having a circuit side and an underside and an area A' where A>4A', with an array of IC chip bonding pads on said circuit side of said silicon IC chip, said array of IC chip bonding pads bonded to said first array of substrate bonding pads, said silicon on silicon interconnection module (b) being bonded to said interposer (a), with said second array of substrate bonding pads being bonded to said first array of interposer bonding pads, and with said silicon on silicon interconnection module at least partially recessed in said opening in said interposer.

2. The IC package of claim 1 wherein said interposer has a coefficient of thermal expansion of less than 6 ppm/° C.

3. The IC package of claim 2 wherein said interposer has a coefficient of thermal expansion that matches within +3 ppm/° C. the coefficient of thermal expansion of the at least one IC chip.

4. An IC package comprising:
  a. a printed wiring board (PWB),
  b. a series of PWB bonding pads on said PWB,
  c. an interposer comprising:
    i. an interconnection substrate having an upper surface and a lower surface,
    ii. at least one quadrilateral cavity formed in said upper surface and extending at least partially through said interposer,
    iii. a first array of interposer bonding pads on said lower surface, said array having a first configuration, said first array of interposer bonding pads being bonded to said series of PWB bonding pads,
    iv. a second array of interposer bonding pads on said upper surface, said second array having essentially the same configuration as said first configuration, said second array of interposer bonding pads being interconnected to said first array of interposer bonding pads by plated-through holes,
  d. a translator interconnected to said interposer and substantially covering said cavity, said translator comprising:
    i. a semiconductor substrate having an upper surface and a lower surface, and an area A,
    ii. an insulating layer on the lower surface of said substrate,
    ii. a first series of translator bonding pads on said insulating layer in the center of the translator,
    iii. a second series of translator bonding pads around said first series of translator bonding pads, said second series of translator bonding pads bonded to said second array of interposer bonding pads,
  e. an IC chip having an upper surface and a lower surface, and an area A', where A>4A', and an array of IC chip bonding pads on said upper surface, said IC chip bonding pads connected to said first series of translator bonding pads, said IC chip at least partially recessed into said cavity.

5. The IC package of claim 4 in which the translator is silicon.

6. The IC package of claim 4 in which the interposer has a coefficient of thermal expansion of less than 6 ppm/° C.

7. The IC package of claim 4 in which the interposer additionally has an array of stress relief openings.

8. The IC package of claim 7 in which the stress relief openings are holes and the holes are larger than said plated-through holes.

9. The IC package of claim 4 wherein the interposer comprises a ball grid array.

10. An IC package comprising:
  a. a printed wiring board (PWB),
  b. a series of PWB bonding pads on said PWB,
  c. an interposer comprising:
    i. an interconnection substrate having an upper surface and a lower surface,
    ii. at least one quadrilateral cavity formed in said upper surface and extending at least partially through said interposer,
    iii. a first array of interposer bonding pads on said lower surface, said array having a first configuration, said first array of interposer bonding pads being bonded to said series of PWB bonding pads,
    iv. a second array of interposer bonding pads on said upper surface, said second array of interposer bonding pads having approximately the same configuration as said first configuration, said second array of interposer bonding pads being interconnected to said first array of interposer bonding pads by plated-through holes, and comprising a group of IC interconnection interposer bonding pads and a group of IC ground interconnection interposer bonding pads,
  d. a translator attached to said interposer and substantially covering said cavity, said translator having an upper surface and a lower surface, and an area A, said translator comprising:
    i'. a semiconductor substrate, said substrate being connected to said group of IC ground interconnection interposer bonding pads, and
    ii'. a first level of translator interconnections on said substrate and insulated therefrom, said first level of translator interconnections connected to said IC interconnection interposer bonding pads,
  e. an IC chip having an upper surface and a lower surface, and an area A', where A>4A', a group of IC chip interconnection bonding pads on said upper surface, and a group of IC chip ground interconnection bonding pads on said upper surface, said IC chip bonded to said lower surface of said translator with said IC chip at least partially recessed into said cavity, and wherein said group of said IC chip interconnection bonding pads are connected to said first level of translator interconnections and said group of said IC chip ground interconnection bonding pads are connected to the semiconductor substrate.

11. The IC package of claim 10 wherein the said substrate is silicon.

12. The IC package of claim 11 in which said interposer is a ball grid array.

13. The IC package of claim 10 in which the said first level of translator interconnections comprise signal interconnections.

14. The IC package of claim 10 including a first plurality of bonding pads and a second plurality of bonding pads on the surface of said translator with via interconnections connecting said first plurality of bond pads and substrate and connecting said second plurality of bond pads to said first level of translator interconnections.

15. The IC package of claim 10 wherein elements bonded together are bonded with solder.

16. The IC package of claim 10 wherein the number of IC chip interconnection bonding pads plus the number of IC chip ground interconnection bonding pads is greater than 400.

17. The IC package of claim 10 in which the interposer has a coefficient of thermal expansion that matches the coefficient of thermal expansion of silicon ±3 ppm/° C.

18. The IC package of claim 10 in which the interposer additionally has an array of stress relief openings.

19. The IC package of claim 19 in which the stress relief openings are holes and the holes are larger than said plated-through holes.

* * * * *